United States Patent [19]

Russell et al.

[11] Patent Number: 5,485,093

[45] Date of Patent: Jan. 16, 1996

[54] RANDOMNESS FAULT DETECTION SYSTEM

[75] Inventors: B. Don Russell; B. Michael Aucoin, both of College Station; Carl L. Benner, Bryan, all of Tex.

[73] Assignee: The Texas A & M University System, College Station, Tex.

[21] Appl. No.: 138,410

[22] Filed: Oct. 15, 1993

[51] Int. Cl.$^6$ .................................................. G01R 31/02
[52] U.S. Cl. ........................................... 324/522; 364/483
[58] Field of Search .................................... 324/536, 522; 364/492, 482, 483; 361/44, 83

[56] References Cited

U.S. PATENT DOCUMENTS

| | | |
|---|---|---|
| 3,308,345 | 3/1967 | Van Cortlandt Warrington . |
| 3,515,943 | 6/1970 | Van Cortlandt Warrington . |
| 4,281,386 | 7/1981 | Kondow et al. . |
| 4,297,738 | 10/1981 | Lee . |
| 4,313,146 | 1/1982 | Lee . |
| 4,347,542 | 8/1982 | Calhoun . |
| 4,347,738 | 9/1982 | Sanderson . |
| 4,466,071 | 8/1984 | Russell, Jr. . |
| 4,470,092 | 9/1984 | Lombardi . |
| 4,559,491 | 12/1985 | Saha . |
| 4,719,580 | 1/1988 | Nimmersjö . |
| 4,751,653 | 6/1988 | Junk et al. . |
| 4,752,886 | 6/1988 | Gareis . |
| 4,766,549 | 8/1988 | Schweitzer, III et al. . |
| 4,785,406 | 11/1988 | Lunderius et al. . |
| 4,795,983 | 1/1989 | Crockett et al. . |
| 4,800,509 | 1/1989 | Nimmersjö . |
| 4,812,995 | 3/1989 | Girgis et al. . |
| 4,851,782 | 7/1989 | Jeerings et al. . |
| 4,853,175 | 8/1989 | Book, Sr. . |
| 4,855,671 | 8/1989 | Fernandes . |
| 4,864,453 | 9/1989 | Bergman et al. . |
| 4,868,704 | 9/1989 | Cavero . |
| 4,871,971 | 10/1989 | Jeerings et al. . |
| 4,878,142 | 10/1989 | Bergman et al. . |
| 4,991,105 | 2/1991 | Pimental . |
| 5,003,486 | 3/1991 | Hendel . |

OTHER PUBLICATIONS

M. Aucoin, B. D. Russell, "Distribution High Impedance Fault Detection Utilizing High Frequency Current Components," *IEEE Transactions on Power Apparatus and Systems*, vol. PAS–101, No. 6, Jun., 1982, pp. 1596–1606.

M. Aucoin, B. D. Russell, "Detection of Distribution High Impedance Faults Using Burst Noise Signals Near 60 Hz," *IEEE Transactions on Power Delivery*, vol. PWRD–2, No. 2, Apr., 1987, pp. 342–348.

B. D. Russell, B. M. Aucoin, T. J. Talley, "Detection of Arcing Faults on Distribution Feeders," EL–2757, Research Project 1285-3, Final Report, Dec., 1982.

Carl Lee Benner, "An Algorithm for Faulted Phase and Feeder Selection Under High Impedance Fault Conditions," A Thesis Submitted to the Graduate College of Texas A&M University, Aug., 1988.

Patrick Wayne Carswell, "The Detection of High Impedance Faults Using Random Fault Behavior," A Thesis Submitted to the Graduate College of Texas A&M University, Aug., 1988.

(List continued on next page.)

Primary Examiner—Maura K. Regan
Attorney, Agent, or Firm—Flehr, Hohbach, Test, Albritton & Herbert

[57] ABSTRACT

A method and apparatus are provided for detecting a fault on a power line carrying a line parameter such as a load current. The apparatus monitors and analyzes the load current to obtain an energy value. The energy value is compared to a threshold value stored in a buffer. If the energy value is greater than the threshold value a counter is incremented. If the energy value is greater than a high value threshold or less than a low value threshold then a second counter is incremented. If the difference between two subsequent energy values is greater than a constant then a third counter is incremented. A fault signal is issued if the counter is greater than a counter limit value and either the second counter is greater than a second limit value or the third counter is greater than a third limit value.

3 Claims, 5 Drawing Sheets

OTHER PUBLICATIONS

C. Benner, P. Carswell, B. D. Russell, "Improved Algorithm for Detecting Arcing Faults Using Random Fault Behavior," *Electric Power Systems Research*, vol. 17, 1989, pp. 49–56.

Expert System for Detecting High Impedance Faults, U.S. Patent Application Ser. No. 08/138,392, filed Oct. 15, 1993, invented by Russell.

Arc Spectral Analysis System, U.S. Patent Application Serial No. 08/138,489, filed Oct. 15, 1993, invented by Russel et al.

Load Analysis System for Fault Detection, U.S. Patent application Ser. No. 08/138,144, filed Oct. 15, 1993, invented by Russell et al.

Load Extraction Fault Detection System, U.S. Patent Application Serial No. 08/138,413, filed Oct. 15, 1993, invented by Russell et al.

Energy Analysis Fault Detection System, U.S. Patent Application Serial No. 08/138,146, filed Oct. 15, 1993, invented by Russell et al.

Arc Burst Pattern Analysis Fault Detection System, U.S. Application Serial No. 08/138,477, filed Oct. 15, 1993, by Russell et al.

"Detection of High Impedance Faults," EPRI Report, EL-2413, Prepared by Power Technologies, Inc., Jun. 1982.

"High Impedance Fault Detection Using Third Harmonic Current," EPRI Report, EL-2430, Prepared by Hughes Aircraft Company, Jun. 1982.

"The Characterization of High Impedance Faults," Prepared by PowerTech Labs, Inc., Canadian Electrical Association, Project 038 D 721, Jun. 1992.

M. Al-Dabbagh, R. Daoud, R. Coulter, "Improved Microprocessor Based Feeder Earth Fault Protection Using Pattern Recognition," Fourth International Conference on Developments in Power System Protection, Edinburgh, UK, Apr. 11–13, 1989.

M. Aucoin, "Status of High Impedance Fault Detection," *IEEE Transactions on Power Apparatus and Systems*, vol. PAS-104, No. 3, Mar. 1985, pp. 638–644.

B. M. Aucoin, J. Zeigler, B. D. Russell, "Feeder Protection and Monitoring System, Part I: Design, Implementation and Testing," *IEEE Transactions on Power Apparatus and Systems*, vol. PAS-104, No. 4, Apr. 1985, pp. 873–879.

B. M. Aucoin, J. Zeigler, B. D. Russell, "Feeder Protection and Monitoring System, Part II: Staged Fault Test Demonstration," *IEEE Transactions on Power Apparatus and System*, vol. PAS-104, No. 6, Jun. 1985, pp. 1456–1462.

H. J. Calhoun, M. T. Bishop, C. H. Eichler, R. E. Lee, "Development and Testing of an Electro-Mechanical Relay to Detect Fallen Distribution Conductors," *IEEE Transactions on Power Apparatus and Systems*, vol. PAS-101, No. 6, Jun. 1982, pp. 1643–1650.

J. Carr, "Detection of High Impedance Faults on Multi-Grounded Primary Distribution Systems," *IEEE Transactions on Power Apparatus and Systems*, vol. PAS-100, No. 4, Apr. 1981, pp. 2008–2016.

R. D. Christie, H. Zadehgol, M. M. Habib, "High Impedance Fault Detection in Low Voltage Networks," IEEE Power Engineering Society Summer Meeting, Seattle, Wash., Jul. 1992, IEEE Paper No. 92 SM 507-4 PWRD.

J. R. Dunki-Jacobs, "The Effects of Arcing Ground Faults on Low-Voltage System Design," *IEEE Transactions on Industry Applications*, vol. IA-8, No. 3, May/Jun. 1972, pp. 223–230.

S. D. Ebron, D. L. Lubkeman, M. White, "A Neural Network Approach to the Detection of Incipient Faults on Power Distribution Feeders," *IEEE Transactions on Power Delivery*, vol. 5, No. 2, Apr. 1990, pp. 905–912.

A. E. Emanuel, D. Cyganski, J. A. Orr, "High Impedance Fault Arcing on Sandy Soil in 15 kv Distribution Feeders: Contributions to the Evaluation of the Low Frequency Spectrum," *IEEE Transactions on Power Delivery*, vol. 5, No. 2, Apr. 1990, pp. 676–684.

A. A. Girgis, W. Chang, E. B. Makram, "Analysis of High-Impedance Fault Generated Signals Using a Kalman Filtering Approach," *IEEE Transactions on Power Delivery*, vol. 5, No. 4, Nov. 1990, pp. 1714–1720.

C. Huang, H. Chu, M. Chen, "Algorithm Comparison for High Impedance Fault Detection Based on Staged Fault Test," *IEEE Transactions on Power Delivery*, vol. 3, Oct. 1988, pp. 1427–1434.

D. I. Jeerings, J. R. Linders, "A Practical Protective Relay for Down-Conductor Faults," *IEEE Transactions on Power Delivery*, vol. 6, Apr. 1991, pp. 565–571.

J. R. Linders, D. I. Jeerings, "Down-Conductor Detection: Theory and Practice," Texas A & M Conference for Protective Relay Engineers, College Station, Tex., Apr. 1993.

D. I. Jeerings, J. R. Linders, "Ground Resistance—Revisited," *IEEE Transactions on Power Delivery*, vol. PWRD-4, No. 2, Apr. 1989, pp. 949–956.

D. I. Jeerings, J. R. Linders, "Unique Aspects of Distribution System Harmonics Due to High Impedance Ground Faults," *IEEE Transactions on Power Delivery*, vol. 5, Apr. 1990, pp. 1086–1092.

A. T. Johns, P. Agrawal, "New Approach to Power Line Protection Based Upon the Detection of Fault Induced High Frequency Signals," *IEE Proceedings, Part C, Generation, Transmission and Distribution*, vol. 137, No. 4, Jul. 1990, pp. 307–313.

R. H. Kaufmann, J. C. Page, "Arcing Fault Protection for a Low Voltage Power Distribution System—Nature of the Problem", *AIEE Transactions on Power Apparatus and Systems*, Jun. 1960, pp. 160–167.

C. J. Kim, B. D. Russell, "A Learning Method for Use in Intelligent Computer Relays for High Impedance Faults," *IEEE Transactions on Power Delivery*, vol. 6, No. 1, Jan. 1991, pp. 109–115.

C. J. Kim, B. D. Russell, K. Watson, "A Parameter-Based Process for Selecting High Impedance Fault Detection Techniques Using Decision Making Under Incomplete Knowledge," *IEEE Transactions on Power Delivery*, vol. 5, No. 3, Jul. 1990, pp. 1314–1320.

C. J. Kim, B. D. Russell, "Harmonic Behavior During Arcing Faults on Power Distribution Feeders," *Electric Power Systems Research*, vol. 14, No. 3, Jun. 1988, pp. 219–225.

C. J. Kim, B. D. Russell, "Classification of Faults and Switching Events by Inductive Reasoning and Expert System Methodology," *IEEE Transactions on Power Delivery*, vol. 4, Jul. 1990, pp. 1631–1637.

C. J. Kim, B. D. Russell, "High Impedance Fault Detection System Using an Adaptive Element Model," *IEE Proceedings-C*, vol. 140, No. 2, Mar. 1993, pp. 153–159.

W. H. Kwon, G. W. Lee, Y. M. Park, M. C. Yoon, M. H. Yoo, "High Impedance Fault Detection Utilizing Incremental Variance of Normalized Even Order Harmonic Power," *IEEE Transactions on Power Delivery*, vol. 6, Apr. 1991, pp. 557–563.

R. E. Lee, M. T. Bishop, "Performance Testing of the Ratio Ground Relay on a Four-Wire Distribution Feeder," *IEEE*

*Transactions on Power Apparatus and Systems,* vol. PAS–102, No. 9, Sep. 1983, pp. 2943–2948.

M. Narendorf, B. D. Russell, M. Aucoin, "Microcomputer Based Feeder Protection and Monitoring System—Utility Experience," *IEEE Transactions on Power Delivery,* vol. PWRD–2, No. 4, Oct. 1987, pp. 1046–1052.

R. M. Reedy, "Minimize the Public Risk of Downed Conductors," *Electrical World,* Sep. 1989, pp. S–36, 38, 40.

B. D. Russell, R. P. Chinchali, "A Digital Signal Processing Algorithm for Detecting Arcing Faults on Power Distribution Feeders," *IEEE Transactions on Power Delivery,* vol. PWRD–3, No. 4, Jan. 1989, pp. 132–140.

B. D. Russell, R. P. Chinchali, C. J. Kim, "Behaviour of Low Frequency Spectra During Arcing Fault and Switching Events," *IEEE Transactions on Power Delivery,* vol. 3, No. 4, Oct. 1988, p. 1485–1491.

B. D. Russell, K. Mehta, R. P. Chinchali, "An Arcing Fault Detection Technique Using Low Frequency Current Components—Performance Evaluation Using Recorded Field Data," *IEEE Transactions on Power Delivery,* vol. PWRD–3, No. 4, Oct. 1988, pp. 1493–1500.

B. D. Russell, K. Watson, "Power Substation Automation Using a Knowledge Based System—Justification and Preliminary Field Experiments," *IEEE Transactions on Power Delivery,* vol. PWRD–2, No. 4, Oct. 1987, pp. 1090–1095.

A. F. Sultan, G. W. Swift, D. J. Fedirchuk, "Detection of High Impedance Arcing Faults Using a Multi–Layer Perceptron," *IEEE Transactions on Power Delivery,* vol. 7, No. 4, Oct. 1992, pp. 1871–1877.

T. J. Talley, "Power Spectrum Estimates of High Frequency Noise Generated by High Impedance Arcing Faults on Distribution Systems," Master of Science Thesis, Texas A & M University, Dec. 1979.

A. R. van C. Warrington, *Protective Relays: Their Theory and Practice,* vol. 2, London: Chapman and Hall, 1969, pp. 340–347 only.

A. C. Westrom, A. P. Sakis Meliopoulos, G. J. Cokkinides, "Open Conductor Detector System," *IEEE Transactions on Power Delivery,* vol. 7, Jul. 1992, pp. 1643–1650.

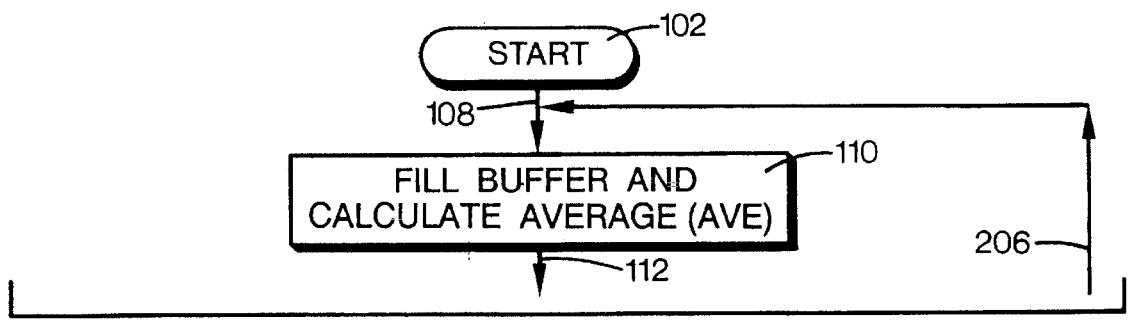
FIG. 3A
FIG. 3B
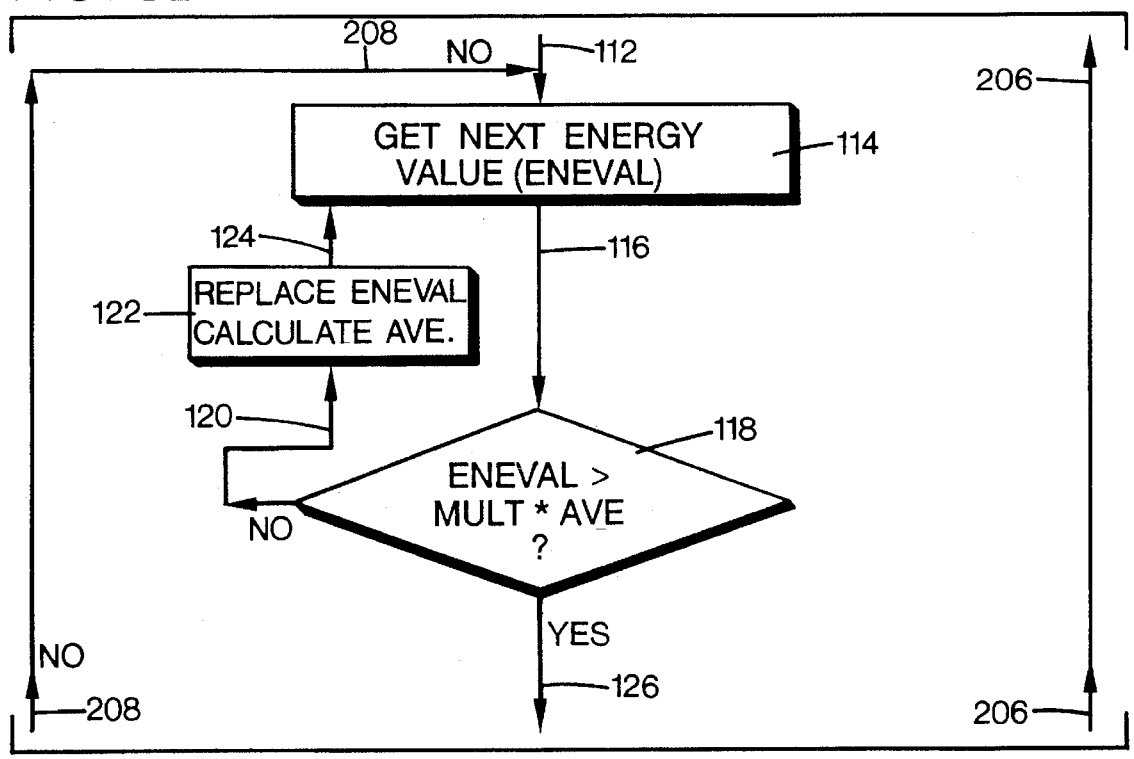

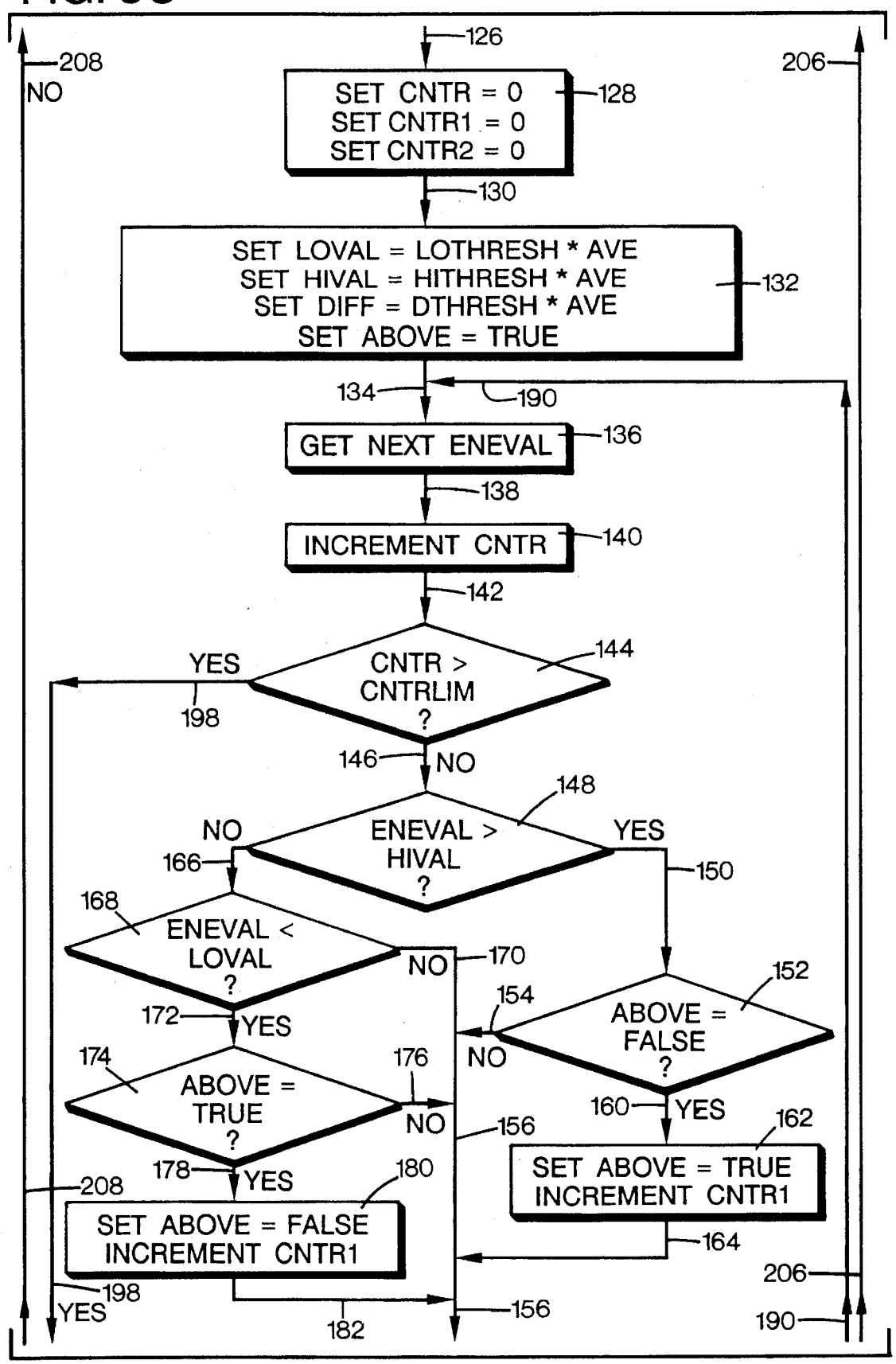
FIG. 3C  EVENT STATE

EVENT STATE (CONTINUED)

RANDOMNESS FAULT DETECTION SYSTEM

This invention was made with government support under contract nos. NAG9-143 and NAG9-192, from the National Aeronautics and Space Administration, (NASA). The United States government may have certain rights in this invention.

BACKGROUND OF INVENTION

The present invention relates generally to a an analysis system for use with an electrical utility power detection system for detecting high impedance, low current arcing faults on the power system. Power system faults may be caused by, for example, downed, broken, tangled or dangling power lines, trees contacting the power lines, and various overcurrent fault situations.

High impedance, low current arcing faults are more difficult to detect than permanent overcurrent faults, which for instance, occur when a transformer fails. Most conventional overcurrent protection devices, such as fuses, reclosers, relays and the like, have time delays which prevent a temporary fault, such as a brief power surge, from de-energizing the power line. Only if the overcurrent fault persists does such a protection device de-energize the power line. Some of these arcing faults may initialize the timing circuits of the overcurrent protection devices but, by the end of the time delay, the high impedance nature of the fault limits the fault current to a low value. Conventional overcurrent protection devices cannot distinguish the high variability and low magnitude of the fault current from the levels of current ordinarily drawn by customers; hence, the line may remain energized even though a dangerous fault condition exists on the power line.

Other methods of detecting faults have focused on the high harmonic frequency content of the line current. These earlier methods compared the magnitude values of line current harmonics with a predetermined reference magnitude value. Two randomness techniques are proposed in the following two articles: W. H. Kwon, G. W. Lee, and Y. M. Park, "High Impedance Fault Detection Utilizing Incremental Variance of Normalized Even Order Harmonic Power," IEEE Transactions on Power Delivery, Vol. 6, April 1991, pp. 557–63; and R. D. Christie, H. Zadehgol, and M. M. Habib, "High Impedance Fault Detection in Low Voltage Networks," IEEE Paper No. 92 SM 507-4PWRD, presented at the IEEE-PES Summer Power Meeting, Seattle, July, 1992. The Christie publication mentions that they have implemented a randomness technique, but no specific algorithm or approach is shown.

The Kwon technique implements a calculation based upon the even order harmonics only, using a set of slow-acting calculations and algorithms. Kwon's technique involves calculation of only the difference of the power of even order harmonics in successive cycles, called the "incremental variance." If this incremental variance is sufficiently high for a sufficient number of cycles, a fault is detected. Clearly, Kwon's approach could be ineffective on faults which demonstrate slowly-changing harmonic levels. Kwon's approach is implemented only on even-order harmonics, ignoring all other harmonics, as well as all non-harmonics.

U.S. Pat. No. 3,308,345 to Warrington detects faults having an appreciable harmonic content, including arcing faults. Warrington monitors the magnitude of a distribution circuit's current at frequencies above the third harmonic by first filtering out the fundamental frequency (e.g. 60 Hertz in the United States and 50 Hertz in Europe) and its second and third harmonics. The magnitude values of the remaining high harmonic frequencies, i.e., the fourth, fifth, etc. harmonic frequencies, are then compared to a predetermined threshold magnitude value. Warrington measures the signals over a predetermined length of time and identifies only one frequency range. If the magnitude value of the high harmonic frequency components exceeds a predetermined threshold, and remains above this threshold for a predetermined length of time, then the Warrington device produces a warning signal.

However, faults often exhibit high variability in magnitude at low frequencies, particularly at nonharmonic frequencies near the fundamental frequency. The earlier methods failed to recognized the high variability of these arcing faults from one half-cycle of the fundamental frequency to another, and thus, were ineffective for detecting many arcing faults.

Moreover, arcing faults may become quiescent for brief or lengthy periods, with no measurable fault current being drawn even though the fault condition still persists. The earlier methods ignored this phenomenon.

Also, if the earlier detection systems set the reference magnitude values too low, then they would often be too sensitive. As a result, the power lines would be de-energized when no hazardous fault existed on the line. Conversely, if the reference magnitude values were set too high, the lines would remain energized even though a dangerous fault existed on the power line.

Thus, a need exists for an improved fault detection system for electrical power utilities which is directed toward overcoming, and not susceptible to, the above limitations and disadvantages.

SUMMARY OF THE INVENTION

The present invention encompasses a randomness fault detection system which detects faults by analyzing the variability of a waveform of a parameter indicative of the power flowing through the line to provide a remaining fault component for analysis. The preferred analysis comprises determining the difference between the energy values of the present parameter waveform and a set of threshold values which are calculated based on arithmetic averages of historic energy values stored in a buffer.

The illustrated embodiment of the present invention tracks a parameter waveform comprising the actual line current to account for changing load conditions when determining whether a high impedance fault has occurred. Voltage waveforms, either line-to-line or line-to-neutral voltages, may also be used as the monitored parameter. This system, as well as the method of fault detection which it illustrates, advantageously minimize unnecessary power service interruptions and outages.

According to another aspect of the present invention, a method is provided for analyzing faults occurring on a power line. In a monitoring step, a parameter indicative of power flowing over the power line is monitored and data samples of the monitored parameter are loaded into an input buffer. In a conversion step, the data samples are converted into energy values and stored in an output buffer. In a comparing step, a first sample energy value based on the monitored parameter is compared to a threshold value. In an updating step, when the first sample energy value is less than or equal to the threshold value, then one of the energy values stored in the output buffer is replaced with the first sample energy value. In a recognizing step, when the first sample energy value is greater than the threshold value, then a signal is produced indicating that the detector has recognized that a fault exists on the power line.

An overall object of the present invention is to provide a fault detection system for detecting high impedance, low current faults that are too small to be properly recognized by conventional overcurrent protection systems.

A further object of the present invention is to provide a fault detection system for accurately identifying dangerous high impedance low current arcing faults.

Another object of the present invention is to provide a fault detection system which is faster, more economical, and more reliable than the earlier systems.

The present invention relates to the above features and objects individually as well as collectively. These and other objects, features and advantages of the present invention will become apparent to those skilled in the art from the following description and drawings.

BRIEF DESCRIPTION OF THE DRAWINGS

FIGS. 3A, 3B, 3C and 3D, referred to herein collectively as "FIG. 3," are adjoining portions of a flow chart illustrating one manner of operating the randomness fault detection system of FIG. 1.

DETAILED DESCRIPTION OF A PREFERRED EMBODIMENT

Figure 1:
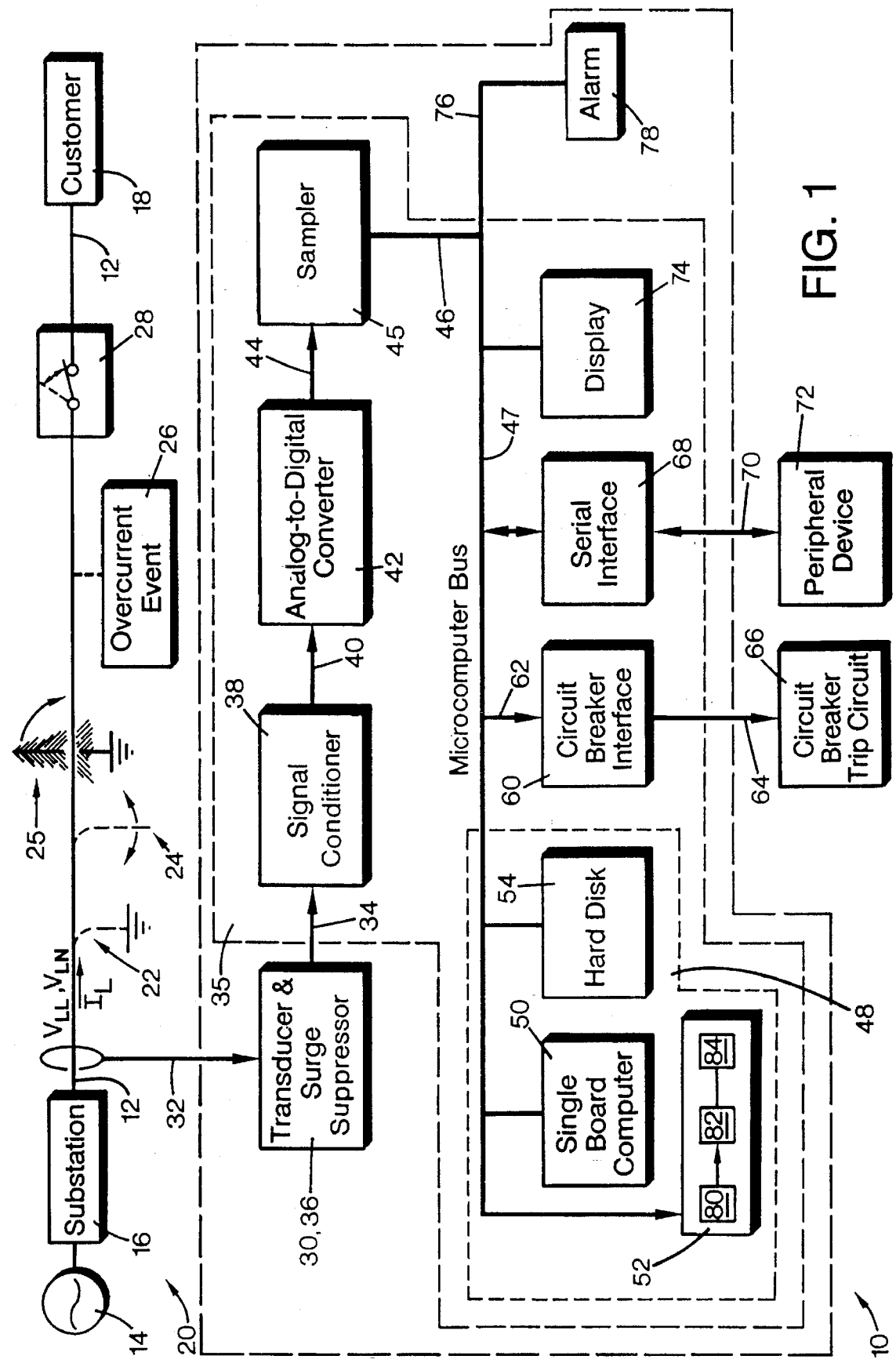
FIG. 1 is a schematic block single line diagram of one form of a randomness fault detection system of the present invention.

Referring to FIG. 1, a randomness fault detection system or detector 10 constructed in accordance with the present invention is shown coupled to detect faults, such as high impedance, low current faults, which may be manifested as arcing faults, on a feeder line 12. The randomness fault detector 10 may be operated alone, or as a portion of a higher level fault analysis scheme, such as the one disclosed in one of the coinventors' other concurrently filed patent applications, entitled, "Expert System For Detecting High Impedance Faults", filed Oct. 15, 1993, Ser. No. 08/138,392. In an alternative embodiment, the detector 10 may be used in conjunction with several other fault analysis schemes. The detector may be coupled in parallel or in series with these other fault analysis systems (not shown).

The feeder line 12 receives power from an AC power source, such as a generating station 14, through a substation 16. Other feeder lines (not shown) may also receive power from the generating station 14 and exit the substation 16. The feeder line 12 delivers power from the substation 16 to a variety of utility customers, such as customer 18.

Altogether, the generating station 14, the substation 16, and feeder line 12 illustrate a portion of an electrical utility's power system 20. Most typical power systems generate and distribute power using a three phase system. Thus, the feeder line 12 may deliver power over three phase lines, known as phases A, B, and C. The feeder line 12 may also have a neutral conductor. For convenience, power system 20 illustrated herein is such a three phase system, illustrated as a single line diagram in FIG. 1.

Between the substation 16 and the customer 18, the feeder line 12 may be subjected to a variety of different types of events, activities and faults. Some typical faults are illustrated in FIG. 1, including an arcing fault caused by a downed conductor 22, a dangling conductor 24, or momentary contact of a tree 25 or other object with the feeder line 12. The system may also be subject to other disrupting events, such as an overcurrent event 26, and a switching event 28 performed by a conventional recloser or the like.

Figure 2:
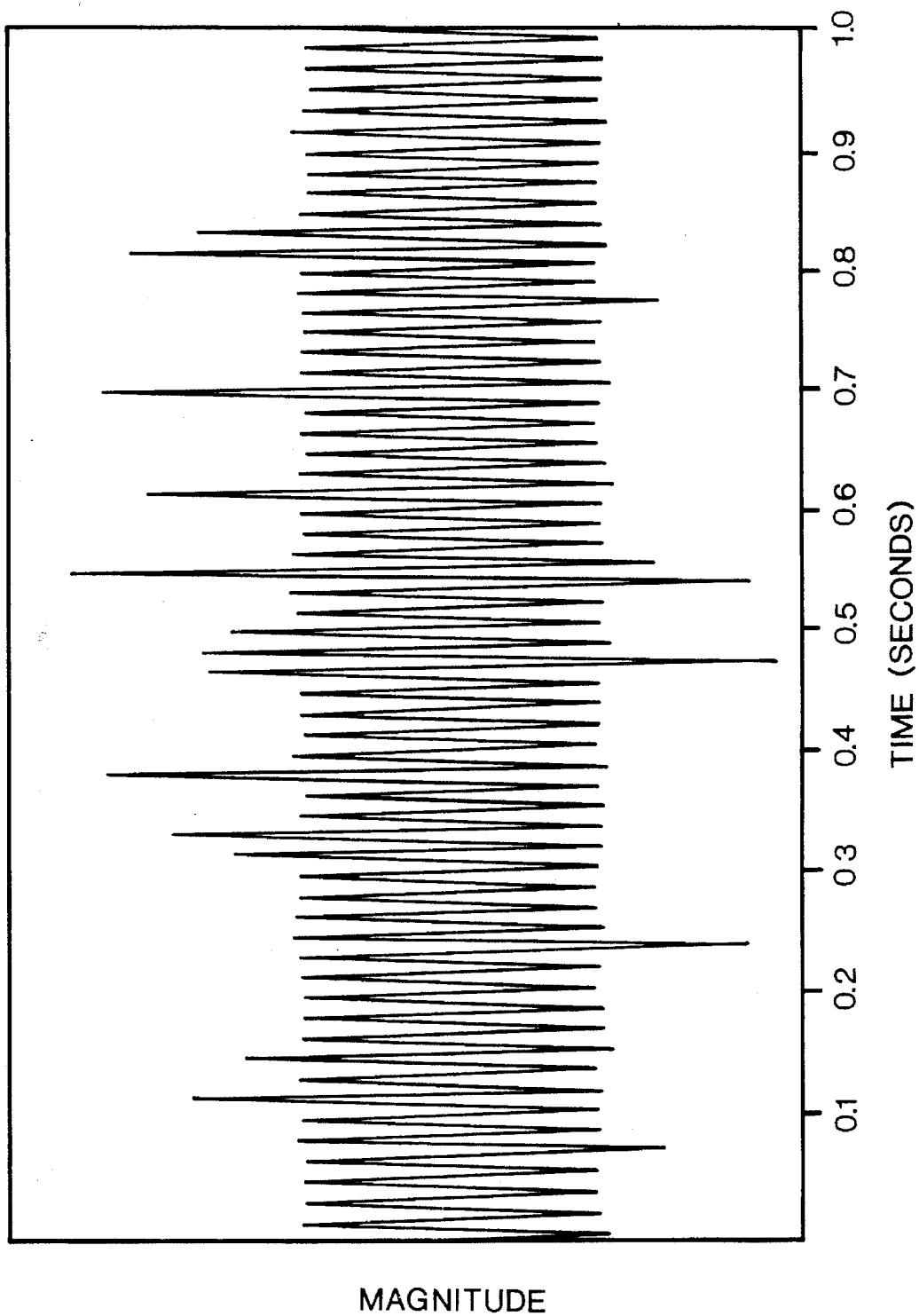
FIG. 2 is a graph showing the variability of a line parameter waveform.

The detector 10 includes a monitoring device, such as a sensor or transducer 30, coupled to feeder line 12 as indicated schematically by line 32. The term "monitoring device" is broadly defined herein to include sensing devices, detecting devices, and any other structurally equivalent device or system understood to be interchangeable therewith by those skilled in the art. The illustrated transducer 30 senses or monitors a line parameter indicative of power flow through the line 12, such as line voltage (line-to-line voltage $V_{LL}$ or line-to-neutral voltage $V_{LN}$), or load current $I_L$. FIG. 2 illustrates a typical variability of the magnitude of a line parameter on feeder line 12 over a time period of one second.

For instance, in response to monitoring the line parameter, the transducer 30 produces a line parameter signal indicative of the monitored parameter representing power delivered by line 12, here, illustrated as a load current $I_L$ signal 34, from which the fault components of the monitored parameter may be determined. The transducer 30 may be a conventional transducer or an equivalent device, such as a multiple phase current measuring device typically having one current transformer per phase, plus one on the neutral conductor, of the feeder line 12. If instead voltage is the selected parameter of monitoring, there are a variety of commercially available voltage transducers known to those skilled in the art that would be suitable for monitoring line-to-line or line-to-neutral voltages. Of course, both voltage and current may be monitored if desired. It is also conceivable that other line parameters may be measured, with suitable transducers selected to accomplish the desired monitoring, for instance, power.

The detector 10 may also include surge protection, for example, a surge suppressor or protector 36. The surge protector 36 may be supplied either with the transducer 30, as illustrated, or as a separate component. The surge protector 36 protects the detector 10 from power surges on the feeder line 12, such as those caused by lightning strikes or the like.

A controller 35 receives the load current signal 34 from transducer 30. It is apparent that signal 34 may represent voltage if that is the parameter monitored by transducer 30. In the illustrated embodiment, the controller 35 may include a signal conditioner 38 for filtering and amplifying the load current signal 34 to provide a clean conditioned load current signal 40. Preferably, the signal conditioner 38 includes a low-pass filter suitable for satisfying the Nyquist criteria of sampling, known to those skilled in the art.

The signal conditioner 38 may also amplify the load current signal 34 for the appropriate gain required by an analog-to-digital (A/D) converter 42. For example, the current flowing on the power system 20 may have a dynamic range of 10 to 10,000 Amps, so the signal conditioner 38 appropriately scales these signals for conversion by the A/D converter 42 from an analog signal 40 into a digital load current signal 44.

When the transducer 30 is an analog device, the controller 35 includes the illustrated discrete A/D converter 42. The transducer 30 may also be implemented as a digital device which incorporates the signal conditioning function of conditioner 38 and the analog-to-digital conversion function of the A/D converter 42.

Additionally, the controller 35 may include a power parameter sampling device or sampler 45. The illustrated sampler 45 samples the digitized current signal 44 at selected intervals to provide an accurate representation of the load level due to rapidly changing conditions, such as during arcing faults.

In the illustrated embodiment, sampler 45 on microcomputer system 48 may convert the digitized data samples into frequency components using Fast Fourier or Discrete Fourier Transform equations or equivalent equations known to those skilled in the art. The equations may be used to form spectra of frequency components which may serve as input parameters to detector 10 for further processing as described in detail below.

In the illustrated embodiment, the sampler 45 provides a sampler signal 46 corresponding to the sampled line parameter values, such as line current $I_L$ or 2.0 voltage (line-to-line $V_{LL}$ or line-to-neutral $V_{LN}$). The sampler signal 46 is supplied via a microcomputer bus 47 to a computing device, such as a microcomputer system 48. The illustrated microcomputer system 48 has a computer, which may be a single-board computer 50, coupled with a memory device, for instance, a random-access memory 52, and a data storage device, such as a hard disk 54. As described in detail below, the random-access memory may include several buffers. A suitable microcomputer system 48 may include a conventional personal computer or any other equivalent device known to be interchangeable by those skilled in the art.

The sampler 45 may measure the line parameter values on a time-domain basis, or the sampling function may be conducted by microcomputer system 48. The transducer 30 monitors the feeder line 12 to detect abnormally high levels of variability of the measured line parameters over a short period of time typically ranging from less than ½ second to over several seconds. This measuring time period may be established by the sampler 45, the transducer 30, and/or the microcomputer system 48. As is apparent, the detector 10 may also detect abnormalities measured over shorter and longer time periods. Other details of the sampling process are described below.

It is apparent to those skilled in the art that other variations of these sensing and sampling functions are also possible. For instance, line-to-line voltages $V_{LL}$ or line-to-neutral voltages $V_{LN}$ may be monitored, sampled and analyzed instead of, or in addition to, monitoring of the line current $I_L$.

The controller 35 has a circuit breaker interface 60 for receiving a trip command signal 62 from the computer 50 via bus 47. In response to the trip command signal 62, the interface 60 sends a trip signal 64 to a circuit breaker trip circuit 66. The trip circuit 66 drives a circuit breaker (not shown) located at substation 16 to de-energize ("trip") feeder line 12.

The controller 35 may also include an optional serial interface 68, such as a modem for sending and receiving a peripheral device signal 70 over a telephone network. The interface 68 may communicate with an external peripheral device 72, such as a remotely located power distribution control center. In some systems, the peripheral device 72 may provide a remote input to the detector 10 via serial interface 68, for example, to override previous programming of the detector 10, such as initial settings, sampling rates, a sampling time period, and the like.

Controller 35 may also include an output device, such as a visual display device 74, or a printer. Preferably, the output display 74 provides a visual indication of the status of detector 10, feeder line 12, and the previous operating conditions of the feeder line. The controller 35 may also provide an alarm signal 76 via bus 47 to an alarm 78, which may be visual, audible, or both.

In the utility industry, it is generally accepted that power distribution involving voltage levels below 25 kV are problematic in the area of high impedance fault detection. The problems associated with this detection are due in part because at this voltage, the arc impedance is relatively high, and therefore, fault current is low. Furthermore, the mechanics of the fault are such that steady arcs are typically not sustained. Thus, the arcing stops before fuses are able to blow and before overcurrent protection devices are able to operate. Of course, this same difficulty may also be encountered in distribution systems operating at voltage levels of 25 kV and above.

Typically, the fault current magnitude of a high impedance fault on the power system 20 is dependant upon the various environmental conditions at the fault site. For example, the current magnitude will fluctuate as the resistance of the current path changes due to the presence of ionized gases, soil particles and the like in the current path, as well as the type of grounding surface in contact with the live conductor. Thus, the fault current magnitude is simply not related the voltage or current levels of the line, nor to the rated to capacities of the distribution system.

Operation

Figure 3D:
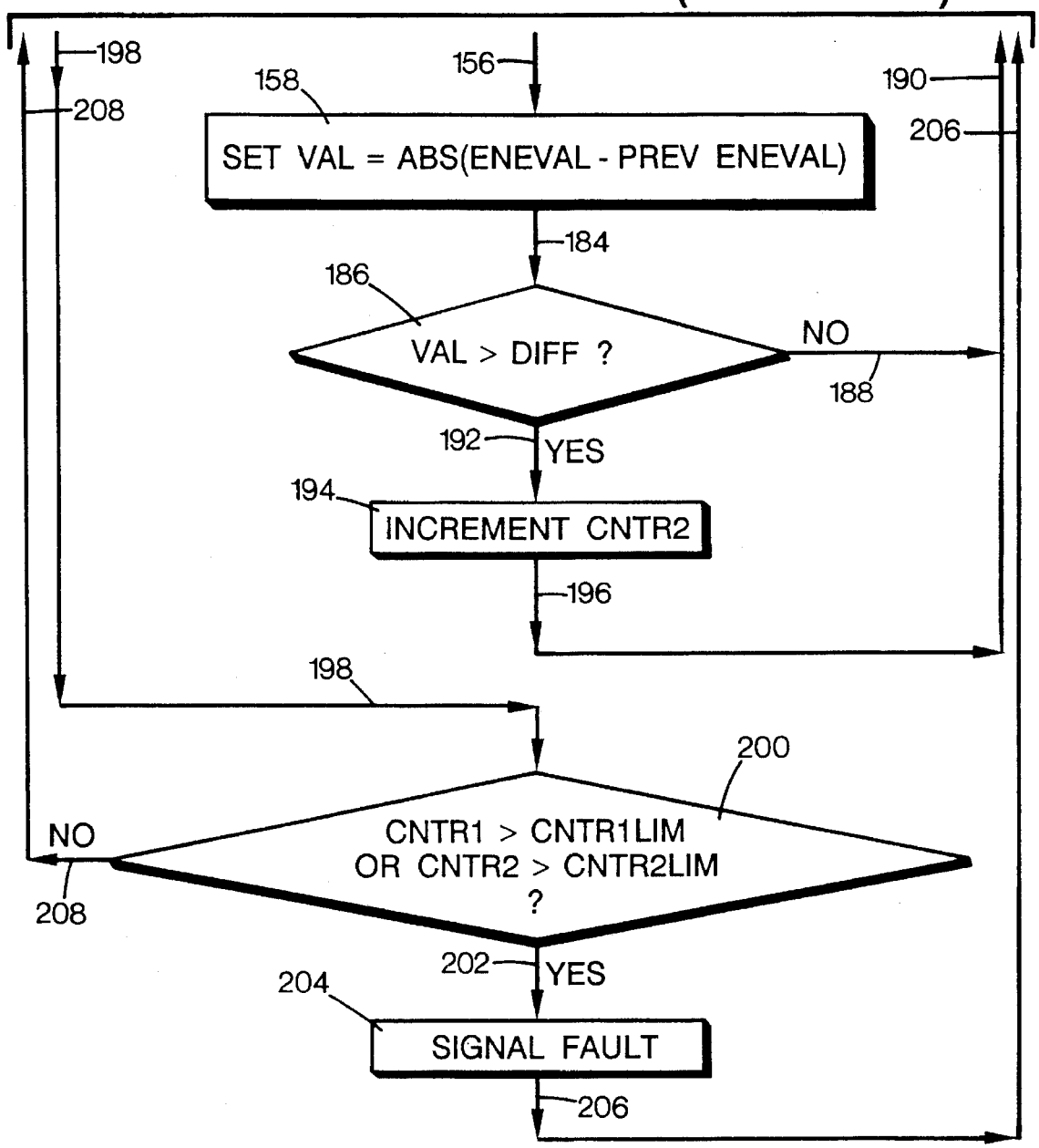

Referring now to FIGS. 3A, 3B, 3C and 3D, collectively referred to herein as "FIG. 3," a flow chart 100, in accordance with the present invention, illustrates a method of processing the sampled feed line data and one manner of operating the randomness fault detector 10. This method is schematically illustrated in flow chart 100 as a series of steps or portions. A portion is defined broadly herein as a component for performing a processing step, as well as a step of the illustrated process, which may be implemented by hardware, software or combinations thereof known to those skilled in the art. The detector control scheme in flow chart 100 is initialized when a START portion 102 issues a start signal 108 upon start-up of the detection system 10.

In general, preferably the software in the microcomputer system 48 analyzes patterns or signatures in the circuit current $I_L$ over time, and from this analysis, then makes determinations about the occurrences which produce the recognized patters. Specifically, the software may identify short duration, randomly variable signatures in different frequency components of the monitored feeder parameter, such as the line current $I_L$, that are associated with arcing, downed conductor faults. If these variations persist for sufficient time, such as on the order of 15 seconds, then a fault is indicated by detector 10. Typically, signatures which vanish before the end of such a timing period are indicative of switching operations, and they are not classified as faults.

The illustrated randomness technique implemented by detector 10 is an improvement over earlier systems because it involves two distinct threshold levels: the signal must go above the higher one and below the lower one as one way to demonstrate variability. The approach of detector 10 advantageously incorporates a second method for indicating variability in rate of change calculation, which was ignored by earlier systems. If a rate of change threshold is exceeded, variability is demonstrated and hence, a fault is detected.

The randomness function of detector 10 may be used in a stand-alone configuration, or in conjunction with fault detection algorithms (not the subject of this disclosure) in the same hardware. Such fault detection algorithms may provide recognition of high current or low current faults on the distribution circuit. The randomness function operates in conjunction with these other algorithms to provide further information so that greater confidence can be placed in the determination of whether or not a fault is present.

Referring back to FIG. 1, in general, the randomness fault detector 10 monitors parameters indicative of power flow and possible fault events on line 12. From this monitoring, detector 10 assembles a collection of data, which is stored in one of buffers 80 or 82 of the RAM 52. In the illustrated embodiment, buffer 80 serves as an input data buffer and first receives the incoming data from the sampler 45. As described in detail below, buffer 82 comprises an output buffer, which receives compressed energy values of the data samples stored in buffer 80. The RAM 52 may also have a counter buffer 84 which provides plural counting functions in response to incrementing signals and zero resetting signals.

If current is the selected parameter for indicating the presence of a fault on line 12, the data stored in buffer 80 may represent the current in each phase, and any residual current flowing on a neutral line of the feeder 12. If voltage is the selected parameter representing power flow through line 12, then the buffers 80, 82 may store data for the line-to-line voltages $V_{LL}$, line-to-neutral voltages $V_{LN}$, or both. It is apparent that the detector 10 may also use both current and voltage as indicators of the power being delivered by line 12 to determine the existence of a fault.

For illustration purposes, the current monitoring embodiment is described in detail, although it is apparent that the detector 10 may operate in a similar manner if voltage ($V_{LL}$ or $V_{LN}$) is the monitored parameter to generate data samples indicative of power flow through line 12. In the illustrated embodiment, the transducer 30 provides analog signals representing the line current $I_L$ for each phase, and any residual current in the neutral conductor, which are then digitized using the A/D converter 42. As explained below, this digitizing may be conducted in conjunction with the operation of sampler 45 using a selected sampling frequency rate for providing a predetermined number of frequency components for each cycle of the current flowing through line 12.

In one embodiment, Fast Fourier Transform or Discrete Fourier Transform equations may be used to convert the data samples stored in buffer 80 into frequency spectra. One manner of converting data samples to frequency spectra is disclosed in one of the coinventors' other concurrently filed patent applications, entitled, "Arc Spectral Analysis System," filed Oct. 15, 1993, Ser. No. 08/138,489. The accuracy of the transform equations may be enhanced by including an electronic filter as a separate device (not shown), or as a portion of conditioner 38, in detector 10 prior to the point where the signal is digitized, such as prior to sampler 45. The filter may be designed to reject the fundamental frequency, as well as other selected frequencies if desired, thereby improving the resolution of the remaining frequency components which would otherwise be dominated by the fundamental frequency. A similar digitizing operation may be performed if feeder voltages, rather than currents, are monitored.

The input buffer 80 preferably accommodates a fixed number of data points, such as the number of measurements corresponding to one second of data, e.g. 1920 samples for a 1920 Hz sampling frequency. The data samples in input buffer 80 are continually updated on a rotational basis with each sampling of the sampler 45. Thus, when new data is added to buffer 80, it replaces one of the data samples, preferably the first measured data sample, stored in input buffer 80, which in turn may be stored in another memory location or deleted. In this manner, the input buffer 80 always stores a data group representing the most recent sampling of the power flow through feeder line 12. This data rotation advantageously allows for a continual adjustment to reflect the daily power swings from peak periods to low use periods, and to dynamically accommodate immediate load changes on the feeder line 12.

In the preferred embodiment, microcomputer system 48 calculates a value proportional to the energy of the digitized data samples stored in buffer 80. The calculation is preferably, but not necessarily, conducted by summing the mathematically squared values of the digitized data samples over an appropriate period of time, such as several tens of milliseconds. As shown in the equation below, the energy E is preferably calculated from N digitized data samples stored in buffer 80 according to the following equation:

$$E = \frac{T}{N} \sum_{j=1}^{N} I^2(j),$$

where:

T=The period over which the energy value E is calculated;

N=Number of data samples digitized per power system cycle; and

I(j)=The jth digitized current sample in the power system cycle, that is, j=1, 2, 3, ..., N.

If voltage is monitored, then I is replaced by V in this equation.

Over time, energy values are calculated as more digitized data samples are stored in buffer 80. In this manner, one energy value is calculated for each N digitized data samples. As described above, the microcomputer 48 may calculate energy values based on the data samples stored in buffer 80. From each frequency spectrum, a single frequency may be chosen as the parameter for calculating the energy values, or an arithmetic average of a plurality of frequency components, such as all frequency components of each frequency spectrum, may be used for calculating the energy values.

For example, the selected frequency component may be one of the odd or even harmonics (integral multiples of the fundamental frequency), such as 120 Hz, 180 Hz, 240 Hz, etc., for a fundamental frequency of 60 Hz. Alternatively, the selected frequency component may be one of the non-harmonic frequencies (any frequency component which is not an integral multiple of the fundamental frequency).

Moreover, the frequency component selected may be a combination of some or all of the even harmonic and/or non-harmonic frequency components. Such a combination approach may provide the greatest sensitivity to downed conductor arcing faults 24, while also maintaining the highest degree of security against incorrect identification by the detector 10 of a non-fault condition as a fault, which would prevent false line trips (de-energizations).

Another useful frequency component which may be selected is the "high frequency" current (or voltage) component, for example, frequencies above 1.0 kHz. Typically, such high frequency components are not obtained using Fast or Discrete Fourier Transform equations, but rather by using an electronic filter, such as a high pass filter well known to those skilled in the art. This filter may be a portion of the signal conditioner 38, selected to remove the undesirable frequency components below the desired threshold, here, 1.0 kHz.

It is apparent that other frequency components may be selected. For instance, one or more of the odd-harmonics (multiples of the fundamental which are not multiples of twice the fundamental frequency) may be used as inputs to the operational scheme illustrated in flow chart 100, although with possibly less attractive results than the other selections mentioned above. The energy values calculated by microcomputer system 48, whether odd or even harmonics, non-harmonics, high or low frequency, or combinations thereof, may be stored in output buffer 82 as explained in detail below.

Referring specifically to FIG. 3A, labeled as the "Initialization State," in response to a system start-up command, from a system operator for instance, the starting portion 102 issues Signal 108 to an initializing portion or initializer 110. In response to signal 108, the initializer 110 begins to load or fill the output buffer 82 with "ENEVAL" energy values calculated by, for example, computer 50 based on the data samples stored in buffer 80, according to the energy value (E) equation given above. It is apparent to those skilled in the art that the calculations to convert the data samples in the input buffer 80 to energy values may be conducted by other devices known to be equivalent to computer 50.

In the illustrated embodiment, the energy values are stored sequentially in the buffer 82 so that the first value is stored in a first memory position, the second energy value in a second memory position, etc. When the energy values are loaded, the initializer 110 calculates and stores an "AVE" arithmetic average value (sum of all values divided by the number of values summed) of the energy values stored in the buffer 82. The AVE average value may be stored in a portion of RAM 52 for retrieval and subsequent updating. When initializer 110 issues a proceed command signal 112, the detector 10 enters a "Normal State," as shown specifically in FIG. 3B. The proceed signal 112 is received by a data retrieval portion or retriever 114.

In response to the proceed signal 112, the retriever 114 obtains the next set of N data samples from input buffer 80 so that computer 50 may calculate the corresponding energy values and load the next available energy value ENEVAL into the buffer 82. When the next ENEVAL energy value is loaded, the retriever 114 sends a next energy value signal 116 to an energy comparison portion or comparator 118. The Normal State sequence illustrated in FIG. 3B is entered from the initialization state of FIG. 3A upon receipt of proceed signal 112, before it is known whether the state is actually normal or not. The state is normal if comparator 118 determines "no" to the query: ENEVAL>(MULT)(AVE), with the multiplication operation being indicated by an asterisk in "*" in flow chart 100. Upon receiving the next energy value signal 116, the comparator 118 compares the retrieved ENEVAL value with a first threshold value comprising the value of the product (indicated by an asterisk "*") of a MULT multiplier value and the AVE average value calculated and stored away by the initializer 110. The value of MULT may be supplied by an operator of the system, for example to adjust the sensitivity of the detector 10. The MULT value may be a constant value or a dynamic value, periodically updated by the detector 10.

If ENEVAL value is not greater than the product of the MULT multiplier value and the AVE average value (i.e., ENEVAL≦(MULT)(AVE)), then comparator 118 issues a NO event signal 120 to an updating or updater 122. In response to the NO event signal 120, the updater 122 replaces the first or oldest energy value stored in buffer 82 with this newest ENEVAL value and calculates a new AVE average value also using this newest ENEVAL energy value.

The updater 122 then issues an updated signal 124 to the retriever 114 which then obtains the next newest ENEVAL energy value from buffer 82 when it becomes available. As described above, the ENEVAL energy value is then compared to the product of MULT multiplier value and the AVE average value. This iteration loop continues until an ENEVAL value is found which is greater than the product of MULT multiplier value and the AVE average value (ENEVAL>(MULT)(AVE)), whereupon the comparator 118 issues a YES event signal 126. Upon issuing the YES signal 126, the detector 10 enters an "Event State," as shown specifically in FIG. 3C.

In the Event State, a second initializing portion or initializer 128 receives the YES signal 126 and resets three counter units within counter 84, specifically, the "CNTR," "CNTR 1," and "CNTR 2" counters, to a zero value (e.g. CNTR=0, CNTR 1=0, CNTR 2=0). The CNTR counter counts the number of ENEVAL energy values analyzed or loaded into the buffer 82 while the detector 10 is in the Event State. The CNTR 1 counter counts the number of times the energy values analyzed are greater than a second threshold value, specifically, a "HIVAL" upper threshold value, or less than a third threshold value, specifically, a "LOVAL" lower threshold value. The CNTR 2 counter counts the number of adjacent (in time) energy values which differ from one another, in absolute value, by more than a specific, "DIFF" amount. The LOVAL, HIVAL and DIFF values are preferably, but not necessarily, predetermined constants, but they may also be dynamic values. When the constants have been set by the second initializer 128, a reset signal 130 is issued to a third initializing portion or threshold initializer 132.

Upon receiving the reset signal 130, the threshold initializer 132 sets or initializes the LOVAL lower threshold value to equal the product of a LOTHRESH constant and the AVE average value (LOVAL= (LOTHRESH)(AVE)). The threshold initializer 132 also initializes the HIVAL upper threshold value to equal the product of a HITHRESH constant and AVE average value (HIVAL=(HITRESH)(AVE)), and the DIFF value is set to the product of a DTHRESH constant and AVE average value (DIFF=DTHRESH * AVE). The LOTHRESH, HITHRESH and DTHRESH constants are all preferably predetermined constants supplied by an operator of the system, for example to adjust the sensitivity of the detector 10. Alternatively, these values may be dynamic variables which are periodically updated by the detector 10. Finally, the initializer 132 sets an "ABOVE" system indicator or flag to a TRUE value (ABOVE=TRUE).

When the ABOVE flag is set, the threshold initializer 132 issues a load signal 134 to a second data retrieval portion or retriever 136, which then obtains and loads the next available ENEVAL energy value into buffer 82. When the next ENEVAL value is loaded into the buffer 82, the retriever 136 issues a new ENEVAL value signal 138 to a CNTR incrementing portion or CNTR incrementor 140. In response to signal 138, the CNTR incrementor 140 increments the count of the CNTR counter (initially set to zero by second initializer 128) from its previous value by one (i.e., $CNTR_N = CNTR_{(N-1)}+1$) because an energy value was loaded into buffer 82 while the detection system 10 was in the Event State (FIG. 3C). When the count of the CNTR counter is incremented, incrementor 140 issues a new count signal 142 to a counter comparing portion or counter comparator 144.

Upon receiving signal 142, the comparator 144 compares the count of the CNTR counter with the value of a CNTR LIM threshold limit. The CNTR LIM limit may be a predetermined threshold value preferably having a value greater than zero. The CNTR LIM value may be supplied by an operator of the system, for example to adjust the sensitivity of the detector 10. The CNTR LIM value may be a constant value or a dynamic value, periodically updated by the detector 10.

If comparator 144 finds the count of the CNTR counter is not greater than the CNTR LIM limit (i.e., CNTR≦CNTR LIM), then the comparator 144 sends a below upper limit or NO signal 146 to an energy comparing portion or energy comparator 148. In response to the NO signal 146, the energy comparator 148 compares the ENEVAL value with the HIVAL value set by the third initializer 132. If the ENEVAL value is greater than the HIVAL value (ENEVAL>HIVAL), then the energy comparator 148 issues an above upper limit or YES signal 150 to a system indication comparator 152. Upon receiving YES signal 150, the comparator 152 compares or determines if the indicator ABOVE flag is equal to a "FALSE" flag setting (ABOVE= FALSE?).

In general, ABOVE flag is set to FALSE when the ENEVAL value is equal to or less than that of HIVAL. Conversely, the ABOVE flag is set to the TRUE setting when the ENEVAL value is greater than that of HIVAL. If the ABOVE flag is not found to be at a FALSE setting by comparator 152 (i.e., ABOVE=TRUE), which occurs when the value of ENEVAL is greater than that of HIVAL as determined by comparator 148, then the comparator 152 sends a no transition or NO signal 154 via a signal bus 156 to a SET VAL establishing portion or establisher 158 (see FIG. 3D).

On the other hand, if the ABOVE flag is found by comparator 152 to be at a FALSE setting, even though comparator 148 has found the value ENEVAL to be greater than the HIVAL limit, then comparator 152 sends an adjustment needed or YES signal 160 to an adjustment portion or adjustor 162. Upon receiving the YES signal 160, the adjustor 162 adjusts the setting of ABOVE flag from FALSE to TRUE (i.e., ABOVE=TRUE). The adjustor 162 also increments the count of the CNTR1 counter from its previous value by one (i.e., $CNTR1_n = CNTR1_{(N-1)}+1$) because one occurrence of ENEVAL being greater than HIVAL has been analyzed. When the count of the CNTR1 counter is incremented, adjustor 162 sends an adjusted signal 164 via bus 156 to the SET VAL establisher 158.

If the comparator 148 determines that the ENEVAL value is not greater than that of HIVAL (i.e., ENEVAL≦HIVAL), then comparator 148 sends a within upper limit or NO signal 166 to a lower limit energy comparison portion or comparator 168. In response to the NO signal 166, the comparator 168 compares the value of ENEVAL with that of LOVAL as set by the third threshold initializer 132.

If comparator 168 finds the value of ENEVAL is not less than that of LOVAL (i.e., ENEVAL≧LOVAL), then the energy comparator 168 sends a not below lower limit or NO signal via bus 156 to the SET VAL establisher 158. If the energy comparator 168 finds the ENEVAL value is indeed less than the LOVAL limit (ENEVAL<LOVAL), then the energy comparator 168 sends a below lower limit or YES signal 172 to an ABOVE flag status comparison portion or comparator 174.

Upon receiving the YES signal 172, the flag comparator 174 determines whether the ABOVE flag is set to a TRUE setting (ABOVE=TRUE?). If ABOVE is not TRUE (i.e ABOVE=FALSE), which is the case when the value of ENEVAL is less than that of LOVAL, then the flag comparator 174 sends a no adjustment needed or NO signal 176 via bus 156 to the SET VAL establisher 158. If the ABOVE flag is set to TRUE, then the ABOVE flag comparator 174 sends an adjustment needed or YES signal 178 to a adjusting portion or adjustor 180. The adjustor 180 then adjusts the setting of the ABOVE flag from TRUE to FALSE (ABOVE=FALSE) since ENEVAL's value is not greater than HIVAL's. In other words, the ABOVE flag is set at TRUE as long as the ENEVAL value is greater than the HIVAL value. The adjustor 180 also increments the count of the CNTR1 counter from its previous value by one (i.e., $CNTR1_N = CNTR1_{n-1}+1$) because one occurrence of ENEVAL being less than LOVAL has been analyzed. The adjustor 180 then sends a new count signal 182 via bus 156 to the SET VAL establisher 158.

Upon receiving signals 154, 164, 170, 176 or 182, carried by bus 156, the SET VAL establisher 158 (FIG. 3D) sets a VAL value to equal the absolute value (indicated in flow chart 100 as the operation "ABS") of the difference between ENEVAL and a previous energy value, PREV-ENEVAL calculated just before ENEVAL.

The SET VAL establisher 158 then sends a new value signal 184 to a difference comparison portion or comparator 186, which compares the value of VAL with the value of DIFF. If the value of VAL is not greater than that of DIFF (i.e., VAL≦DIFF), then comparator 186 issues an increment not needed or NO signal 188 via a signal bus 190 back to the second retriever 136 (FIG. 3C) to load the next ENEVAL value into buffer 82 as described above. If the value of VAL is greater than that of DIFF (VAL>DIFF), then the comparator 186 sends a YES increment signal 192 to a CNTR2 incrementing portion or incrementor 194. The incrementor 194 then increments the count of the CNTR2 counter from its previous value by one (i.e., $CNTR2_n = CNTR2_{(N-1)}+1$) because the difference between two adjacent energy values ENEVAL and PREV ENEVAL stored in buffer 82 is greater than DIFF. When CNTR2 is incremented, incrementor 194 sends a next-value signal 196 via bus 190 back to the second retriever 136 (FIG. 3C) to load the next ENEVAL value into buffer 82, as described above. This iteration continues as long as the count of the CNTR counter determined by the comparator 144 is less than or equal to CNTRLIM value.

If the count of the CNTR counter in comparator 144 is greater than the CNTRLIM value (CNTR>CNTRLIM), then comparator 144 sends a YES above limit signal 198 to a counter comparison portion or comparator 200. In response to signal 198, comparator 200 compares the counts of the CNTR1 and CNTR2 counters to predetermined threshold limits CNTR1 LIM and CNTR2 LIM, respectively.

If comparator 200 finds the CNTR1 count is greater than CNTR1 LIM or the CNTR2 count is greater than CNTR2 LIM, then the comparator 200 issues a YES fault signal 202 to a fault signalling portion 204. In response to YES fault signal 202, fault signalling portion 204 sends a fault signal 282 back to the initializer 110, indicating that there is a fault on the power line. In response to signal 206, the initializer 110 deletes, or transfers, the energy values stored in buffer 82 and re-fills the buffer 82 with a new set of energy values based on data samples stored in input buffer 80 and calculates a new average AVE as described above. The fault portion 204 may also send a fault signal to circuit breaker 66, peripheral device 72 or to an equivalent place to indicate that a fault exists on feeder line 12.

If comparator 200 finds that the CNTR1 count is equal to or less than CNTR1 LIM (CNTR1≦CNTR1 LIM) and the CNTR2 count is equal to or less than CNTR2 LIM (CNTR2≦CNTR2 LIM), then comparator 200 sends a NO fault signal 208 back to loader 114 in the NORMAL state to load the next ENEVAL into buffer 82 and the iteration continues, as described above.

Having illustrated and described the principles of our invention with respect to a preferred embodiment, it should be apparent to those skilled in the art that our invention may be modified in arrangement and detail without departing from such principles.

For example, while the illustrated embodiment has been implemented in computer software, or discussed in terms of devices, it is apparent that structural equivalents of the various components and devices may be substituted as known to those skilled in the art to perform the same functions. Furthermore, while various hardware devices, such as the transducer, sampler and microcomputer system are illustrated, it is apparent that other devices known to be interchangeable by those skilled in the art may be substituted. We claim all such modifications falling within the scope and spirit of the following claims.

We claim:

1. A method of detecting faults occurring on a power line that carries a power signal, said method comprising the steps of:

sampling said power signal to obtain energy values;

storing said energy values in a buffer to form buffered energy values;

generating a first threshold value based on the average of said buffered energy values;

sampling said power signal to obtain a new energy value;

comparing said new energy value to said first threshold value;

replacing one of said buffered energy values with said new energy value when said new energy value is less than or equal to said first threshold value;

executing event state operations when said new energy value is greater than said first threshold value, said executing step including the steps of sampling said power signal to obtain event state energy values, establishing a first count of the number of times said event state energy values are greater than an upper threshold value or less than a lower threshold value and determining whether said first count exceeds a predetermined threshold and thereby indicates a fault exists on said power line, and maintaining a second count of the number of adjacent event state energy values that differ from one another, in absolute value, by more than a predetermined amount and determining whether said second count exceeds a specified threshold and thereby indicates a fault exists on said power line.

2. The method of claim 1 wherein said energy values correspond to the current of said power signal.

3. The method of claim 1 wherein said energy values correspond to the voltage of said power signal.

* * * * *